(12) United States Patent
Herbordt et al.

(10) Patent No.: US 9,075,108 B2
(45) Date of Patent: Jul. 7, 2015

(54) METHOD AND A DEVICE FOR PREVENTING SIGNAL-EDGE LOSSES

(75) Inventors: Wolfgang Herbordt, Munich (DE); Thomas Kuhwald, Markt Schwaben (DE); Bernhard Nitsch, Munich (DE); Friedrich Reich, Stadtbergen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 13/583,856

(22) PCT Filed: Jul. 19, 2011

(86) PCT No.: PCT/EP2011/062297
§ 371 (c)(1),
(2), (4) Date: Sep. 10, 2012

(87) PCT Pub. No.: WO2012/019880
PCT Pub. Date: Feb. 16, 2012

(65) Prior Publication Data
US 2013/0003815 A1   Jan. 3, 2013

(30) Foreign Application Priority Data
Aug. 12, 2010   (DE) .......................... 10 2010 034 068

(51) Int. Cl.
*H04B 3/46*   (2006.01)
*H04B 17/00*   (2006.01)
*G01R 31/317*   (2006.01)

(52) U.S. Cl.
CPC ................................ *G01R 31/31708* (2013.01)

(58) Field of Classification Search
CPC ........................... G01R 31/31708; H04N 9/045
USPC ...................... 375/224, 228; 702/66; 358/3.12
See application file for complete search history.

(56) References Cited

U.S. PATENT DOCUMENTS 6,768,430 B1 *   7/2004   Weinstein ........................ 341/61
6,847,905 B2   1/2005   Etheridge et al.
(Continued)

FOREIGN PATENT DOCUMENTS

DE   10 2007 018 095 A1   6/2008
EP   0 123 381 A1   10/1984
(Continued)

OTHER PUBLICATIONS

International Search Report for corresponding PCT Application No. PCT/EP2011/062297 Apr. 17, 2012.
(Continued)

*Primary Examiner* — Sam K Ahn
*Assistant Examiner* — Fabricio R Murillo Garcia
(74) *Attorney, Agent, or Firm* — Ditthavong & Steiner, P.C.

(57) ABSTRACT

A method for marking a signal edge, which has been removed from at least one decimated binary signal after the decimation of an associated binary signal, within the decimated binary signal, establishes successive signal portions of the respective binary signal, in each case with a number of sampled values corresponding to a decimation factor of the decimation. It detects a signal edge removed through decimation from each signal portion if the number of signal edges determined in each signal portion of the respective binary signal is greater than one. Then, the sampled values of the respective decimated binary signal are determined through decimation of the sampled values of the associated binary signal with the decimation factor, and the removed signal edge at the sampling time of the decimated binary signal which corresponds to the signal portion of the associated binary signal with the signal edge removed through decimation is marked.

16 Claims, 8 Drawing Sheets

(56) References Cited

U.S. PATENT DOCUMENTS

| | | |
|---|---|---|
| 6,934,646 B2 | 8/2005 | Montijo |
| 2003/0218780 A1* | 11/2003 | Braun et al. .................. 358/3.12 |
| 2004/0078157 A1* | 4/2004 | Montijo ........................... 702/66 |
| 2005/0111572 A1* | 5/2005 | Kuroda et al. ................. 375/295 |
| 2005/0207676 A1* | 9/2005 | Lin et al. ........................ 382/299 |
| 2011/0164816 A1* | 7/2011 | Guo ................................ 382/165 |

FOREIGN PATENT DOCUMENTS

| | | |
|---|---|---|
| EP | 1 783 505 A1 | 5/2007 |
| JP | 04-138375 A | 5/1992 |
| JP | 2008-170246 A | 7/2008 |
| WO | WO 2008/051856 A2 | 5/2008 |

OTHER PUBLICATIONS

International Preliminary Report on Patentability with Translation of Written Opinion of the International Searching Authority for International Application No. PCT/EP2011/062297, dated Feb. 12, 2013, pp. 1-18.

* cited by examiner sampling time k:k$_0$    k$_0$+3    k$_0$+6    k$_0$+9    k$_0$+12    k$_0$+15    k$_0$+18    k$_0$+21 signal portion n:n$_0$    n$_0$+1    n$_0$+2    n$_0$+3    n$_0$+4    n$_0$+5    n$_0$+6    n$_0$+7

Screen column: n-n$_0$    n$_0$+3    n$_0$+6

Legend:
- : activated signal level
- : non-activated signal level
- : positive and/or negative signal edge
- : more than two signal edges (=removed signal edge)
- : edge inaccuracy

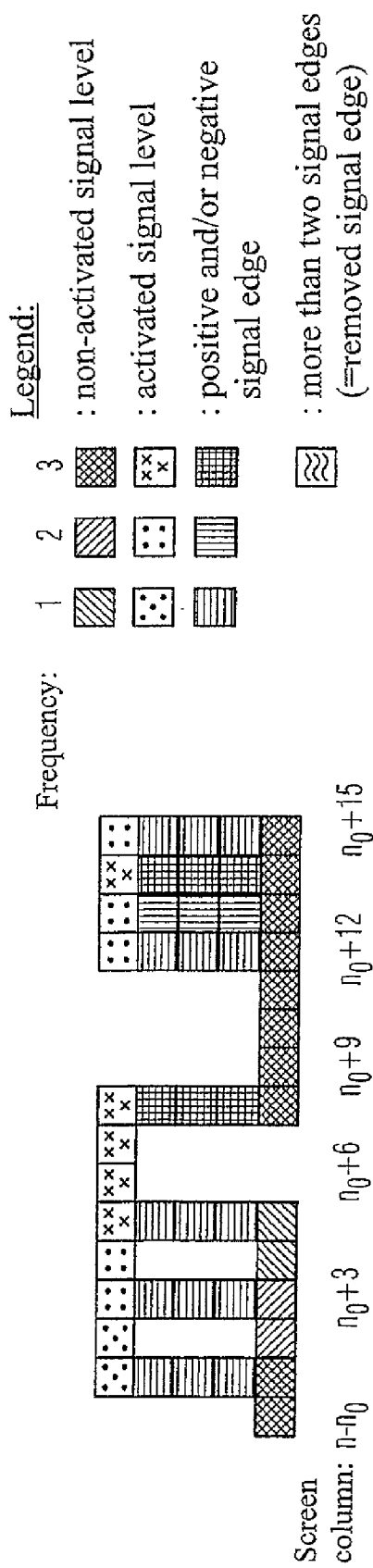
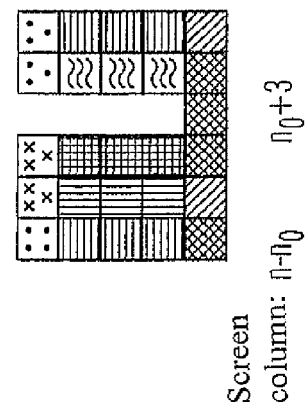
Fig. 2B
Fig. 2C

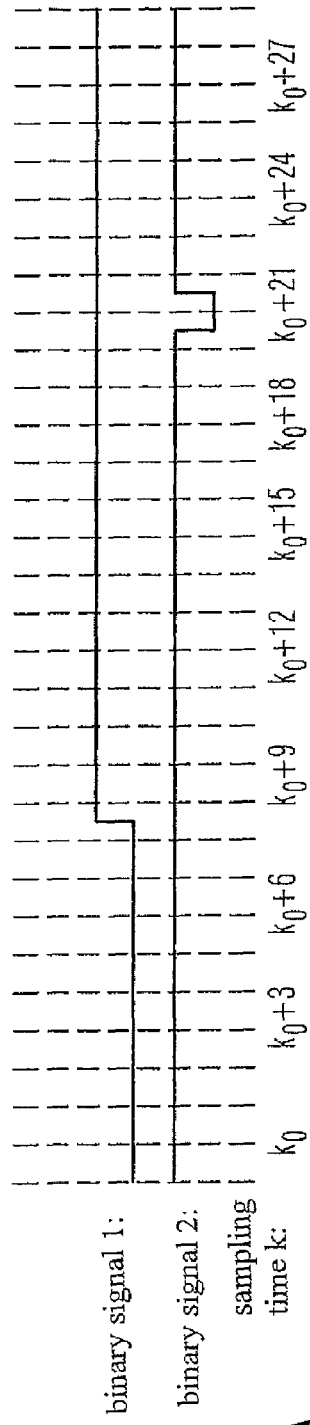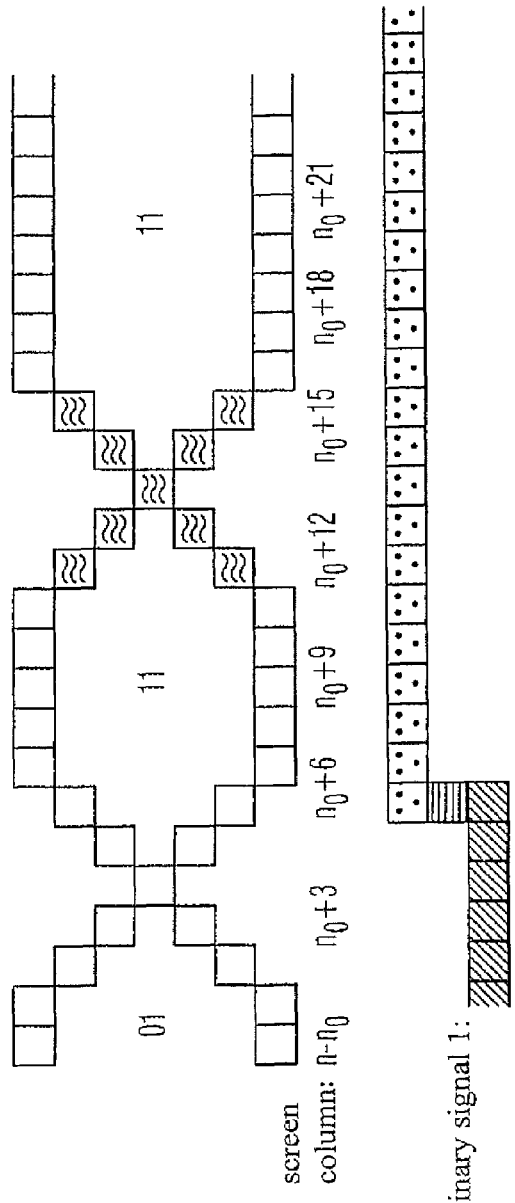
Fig. 3A
Fig. 3B

METHOD AND A DEVICE FOR PREVENTING SIGNAL-EDGE LOSSES

CROSS-REFERENCE TO RELATED APPLICATION

The present application is a national phase application of PCT Application No. PCT/EP2011/062297, filed on Jul. 19, 2011, and claims priority to German Application No. DE 10 2010 034 068.5, filed on Aug. 12, 2010, the entire contents of which are herein incorporated by reference.

BACKGROUND OF THE INVENTION

1. Field of the Invention

The invention relates to a method and a device for preventing signal-edge losses through decimation of binary signals.

2. Discussion of the Background

Binary signals with a given sampling rate are converted through decimation with a given decimation factor into decimated binary signals with a reduced sampling rate. Alongside the decimation with a fixed decimation factor, decimation with a variable decimation factor is also very common. For example, a decimation with a variable decimation factor is disclosed in DE 10 2007 018 095 A1.

If a binary signal and if the binary signals associated with a bus signal are decimated with a decimation factor, signal edges in the decimated binary signal or in the decimated binary signals associated with the bus signal can disappear. In this context, several signal edges per decimation interval, and associated with this entire pulses or pulse pauses, can be lost. This loss of signal information is unacceptable, especially in applications which depend upon an exact signal analysis.

SUMMARY OF THE INVENTION

Embodiments of the invention advantageously provide a method and a device for detecting and marking such signal-edge losses in the decimation of binary signals and a method and a device for preventing such signal-edge losses in the decimation of binary signals.

For the marking of signal-edge losses in decimated binary signals, successive signal portions with a number of sampled values corresponding to the decimation factor, which correspond to the individual decimation intervals, are determined in every binary signal. In each of these signal portions, the number of signal edges before the decimation of the respective binary signal is counted in each case. If the number of signal edges detected in the respective signal portion is greater than one, these signal edges can no longer be exactly reconstructed after the decimation, especially with regard to their signal-edge direction, even taking into consideration the signal-level information of the respectively preceding and of the respectively following signal portions, and are therefore lost for a detailed signal analysis. According to the invention, in this case, the signal edge in the sampled value of the respective decimated binary signal, which relates to the signal portion of the associated binary signal with more than one detected signal edge, is marked, for example, with a particular color or grey tone.

While a signal edge, a pulse or a pulse pause between two successive pulses in the decimated binary signal cannot be directly recognised and therefore detected under some circumstances, this is presupposed in the non-decimated binary signal. The distance between two signal edges, the pulse duration and the pulse pause between two pulses in a binary signal must consequently correspond at least to the distance between two sampled values of the binary signal.

Signal edges in binary signals respectively associated with a bus signal or in several sequentially successive signal portions of an individual binary signal are marked in different ways.

In a first variant, by analogy with the case of a single binary signal, signal edges removed through decimation from a binary signal or from several binary signals of a bus signal, are signalled through a special marking of the signal edge at the sampling time of the respective, decimated binary signal, which relates to the signal portion of the associated binary signal with at least one signal edge removed through decimation.

In a second variant, the individual binary signals associated with a bus signal are combined to form a single binary signal, wherein the frequency of the significance of the signal level—activated signal level or non-activated signal level—over all binary signals of the bus signal at a given sampling time is displayed as a specific color or grey tone or as a specific pattern of the pixel/s of the visualization device associated with the significance of the signal level or the signal edge and the sampling time. As in the first variant, a signal edge removed through decimation is once again marked by a special color or grey tone.

Alongside this, in a third variant, a signal edge removed through decimation in at least one binary signal of the bus signal is signalled at the same sampling time through pixels, separately marked—for example with a special color or grey tone—representing a positive and at the same time a negative signal edge, at a horizontal position on the visualization unit associated with the sampling time.

If no removed signal edges are detected respectively at the adjacent sampling times in the decimated binary signals, the pixels representing a negative and positive signal edge are converted respectively into pixels in the horizontal positions on the visualization unit associated with respectively adjacent sampling times, which each represent an activated signal level and a non-activated signal level of binary signals of the bus signal. In the event that no removed signal edge is detected at the respective sampling time of the decimated binary signals, the significance of the signal level of the individual binary signals of the bus signal is expressed as a binary, octal or hexadecimal value or as a value of any other numerical system and displayed at the horizontal position on the visualization device associated with the respective sampling time.

Alternatively, in a fourth variant, the significance expressed as a binary, octal or hexadecimal value of the signal level of the individual binary signals associated with the bus signal is displayed in combination with the associated sampling time as an ordinate-abscissa value pair in a pixel of the visualization device associated with the ordinate-abscissa value pair in a given color or grey tone. The pixels associated with the individual ordinate-abscissa value pairs are displayed through pixels of the visualization device with interposed ordinate values, which are disposed on a vertical straight line with the abscissa value which corresponds to the higher abscissa value of the two ordinate-abscissa value pairs.

If a removed signal edge is present at one or more sampling times, the pixels of the visualization unit on a vertical straight line at the abscissa value associated with the sampling time are marked in a special color or grey tone. The uppermost and lowermost pixel on the vertical straight line associated with the removed signal edge in each case mark the limits of the value range of the binary, octal or hexadecimal value, which results from the non-unambiguous assignment of the signal level of a binary signal to a value in the event of a removed signal edge. Every pixel disposed on the straight line or also only every n-th pixel disposed on the straight line can be used for the display. As an alternative, all pixels of the screen column in which the removed signal edge is disposed can be marked.

Finally, in a fifth variant, the significance, expressed as a binary, octal or hexadecimal value, of the signal levels of the individual binary signals at the individual sampling times associated with the bus signal is displayed on the visualization device in each case as a tabular value. If a removed signal edge is present in one or more of the binary signals of the bus signal at one of the sampling times, the associated binary, octal or hexadecimal character of the binary, octal or hexadecimal value associated with the respective sampling time is given a special character, for example, an X, and is optionally marked by color highlighting of the special character with a special color.

A signal-edge loss determined through decimation is prevented by continuously matching the decimation factor to the signal-edge characteristic of the binary signal or of the binary signals associated with the bus signal.

For this purpose, in a first embodiment of a detector, the number of signal edges in each individual signal portion of the individual binary signals is counted. Following this, the decimation factor, and accordingly the number of sampled values in each individual signal portion, is adjusted by a control unit until it is guaranteed that no more than one signal edge occurs in each individual signal portion of the individual binary signals.

In a second embodiment, the pulse durations of all pulses and the durations of pulse pauses between successive pulses in all binary signals are measured continuously by a detector over respectively successive periods of time, and the minimal pulse duration or respectively the minimal pulse pause is determined in each case. Following this, the decimation factor is varied continuously by a control unit until the decimation factor is smaller than or equal to the number of sampled values determined for the minimal duration.

BRIEF DESCRIPTION OF THE DRAWINGS

The method according to the invention and the device according to the invention for marking a signal edge removed through decimation, the method according to the invention and the device according to the invention for matching the decimation factor dependent upon the number of signal edges per number of sampled values and the method according to the invention and the device according to the invention for matching a decimation factor dependent upon the duration of pulses and/or pulse pauses are explained in detail below with reference to the drawings. The drawings are as follows:

FIG. 2B shows a display according to an embodiment of the invention of the frequencies of signal levels and signal edges of the three binary signals associated with a bus signal;

FIG. 2C shows a display according to an embodiment of the invention of the frequencies of signal levels and signal edges of the three decimated binary signals associated with a bus signal;

FIG. 3A shows a time-flow diagram with two binary signals associated with a bus signal;

FIG. 3B shows two displays according to an embodiment of the invention of the two binary signals associated with a bus signal, which contain signal edges;

DETAILED DESCRIPTION OF EXEMPLARY EMBODIMENTS OF THE INVENTION

Figure 1A:
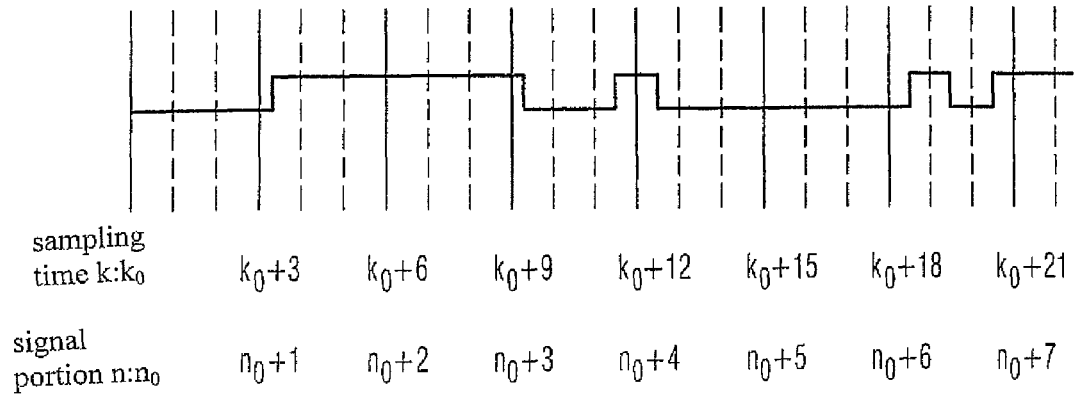
FIG. 1A shows a time-flow diagram of a binary signal to be compressed in time on the display with sampling times.
Figure 5:
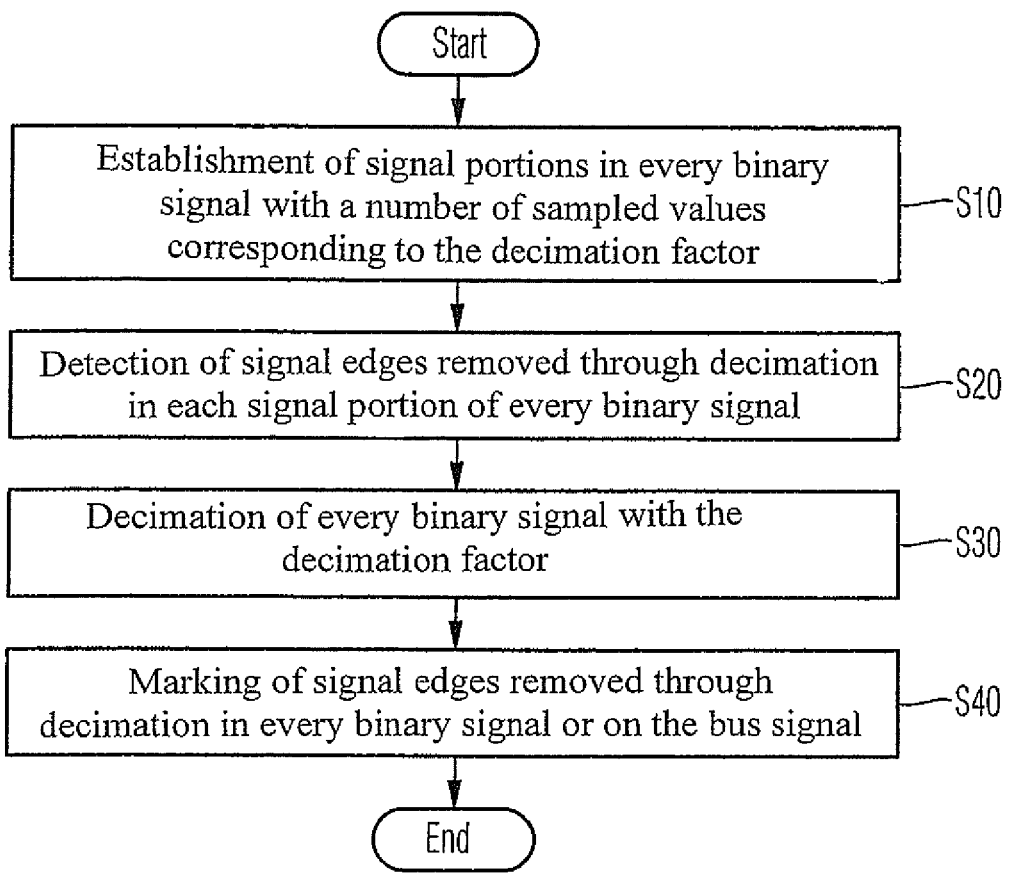
FIG. 5 shows a flow chart for a method according to an embodiment of the invention for marking a signal edge removed through decimation.
Figure 8:
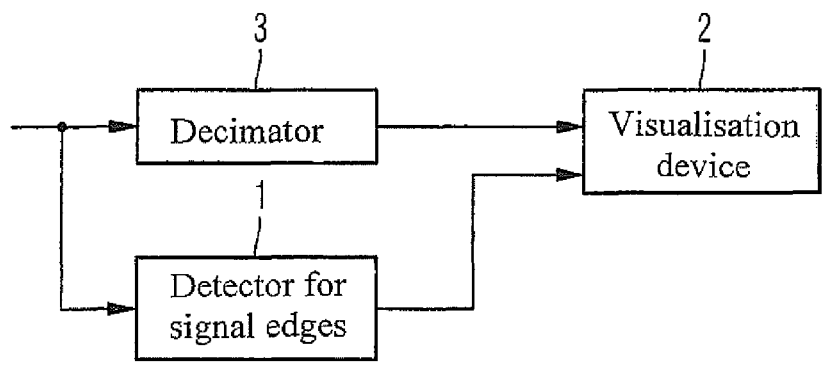
FIG. 8 shows a block-circuit diagram for a device according to an embodiment of the invention for marking a signal edge removed through decimation.

In the following section, embodiments of the method according to the invention and embodiments of the device according to the invention for marking signal edges removed through decimation are explained on the basis of the flow diagram in FIG. 5 and the block-circuit diagram in FIG. 8:

In the first method step S10, in each case for the binary signal to be decimated or respectively for each binary signal associated with a bus signal to be decimated, successive signal portions are established with a fixed number of sampled values, which corresponds to the decimation factor of the decimation. In FIGS. 1A and 3A, each signal portion corresponds to a region of three sampled values limited in each case by two continuous lines.

In the next method step S20, in each signal portion of the binary signal to be decimated or respectively of the binary signals associated with a bus signal to be decimated established in the preceding method step S20, each signal edge, which is not unambiguously recognizable as such in the associated binary signal decimated through a decimation to be implemented in the subsequent method step S30 and which accordingly counts as a signal edge removed through decimation, is detected in a detector 1 for signal edges.

After the decimation, an individual signal edge within a signal portion of a binary signal can be unambiguously identified—also with regard to its signal-edge direction—if the respectively preceding and/or the respectively following signal portions each contain only one signal edge and are each framed by a signal portion without a signal edge. For example, the signal edge at the sampling time $k_0+3$ of FIG. 1A represents the only signal edge in the second signal portion $n_0+1$ of the binary signal. Since the signal levels at all sampling times of the preceding signal portion $n_0$ are non-activated, and at the same time, the signal levels at all sampling times of the following signal portion $n_0+2$ are activated, a signal edge with a positive edge direction can be unambiguously inferred from the display of the associated decimated binary signal in FIG. 1B. Also, the single signal edge of the fifth signal portion $n_0+4$ at the sampling time $k_0+12$ can be unambiguously identified as a falling edge in the display of FIG. 1B, because all of the sampled values of the following, sixth signal portion $n_0+5$ of the binary signal are non-activated.

By contrast, if two signal edges per signal portion are present, these two signal edges with their correct signal-edge directions cannot be unambiguously determined from the signal-level characteristic of the decimated binary signal. The two signal edges—falling and rising signal edge—in the fourth signal portion $n_0+3$ of the binary signal in FIG. 1A cannot be unambiguously identified with their correct signal-edge direction from the associated decimated binary signal in FIG. 1B, because a single signal edge—a falling signal edge—is present in the following fifth signal portion $n_0+4$. This combination cannot be unambiguously distinguished from the combination in which a single signal edge—a falling signal edge—is present in the fourth signal portion $n_0+3$ and at the same time two signal edges—a rising signal edge and a falling signal edge—are present in the fifth signal portion $n_0+4$.

Moreover, a number of three, four or more signal edges in the signal portion of the decimated binary signal cannot unambiguously be distinguished from a case with the presence of one signal edge per signal portion in the binary signal. Accordingly, two or more signal edges per signal portion in the decimated binary signal cannot be unambiguously identified as such. The three signal edges in the seventh signal portion $n_0+6$ cannot be unambiguously identified, because it is also possible, from the analysis of the signal level of the decimated binary signal in the adjacent signal portions $n_0+5$ and $n_0+7$, to infer a signal portion with a single signal edge.

In the next method step S30, the binary signal or respectively the binary signals associated with the bus signal are decimated in a decimator 3 with the fixed decimation factor identical for all binary signals.

Finally, in the final method step S40, the display of the decimated binary signal or respectively the decimated binary signals associated with the bus signal is implemented, and the marking of the signal edges removed by the decimation on the display of the visualization device 2 takes place.

Figure 1B:
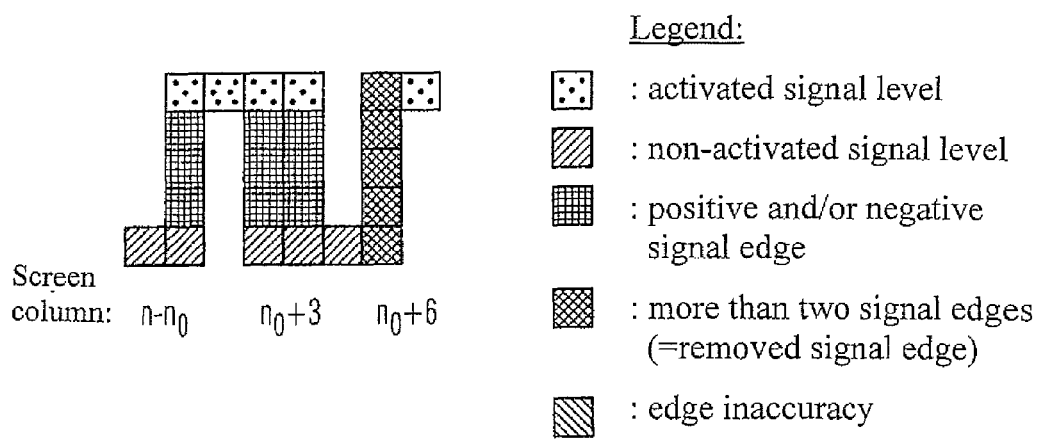
FIG. 1B shows a display according to an embodiment of the invention of a decimated binary signal with signal edges removed through decimation.

In the case of a decimation of a single binary signal, the sampled values of the associated decimated binary signal are displayed as shown in FIG. 1B, respectively as pixels on the display of the visualization device 2, wherein the significance of the signal level of the respective sampled value is given the ordinate value, and the associated sampling time is given the abscissa value of an ordinate-abscissa value pair, which corresponds to the ordinate-abscissa value pair of the associated pixel. Signal edges are displayed by pixels on a vertical straight line between a pixel, of which the ordinate value represents an activated signal level of a sampled value of the decimated binary signal, and a pixel of which the ordinate value represents a non-activated signal level of a sampled value of the decimated binary signal. Signal edges removed through decimation in the decimated binary signal are marked with pixels in a separate color or grey tone. Every pixel disposed on the straight line or also only every n-th pixel disposed on the line can be used for the display. As an alternative, all pixels of the screen column in which the removed signal edge is disposed can also be marked.

In the case of a decimation of several binary signals respectively associated with a bus signal, the frequency of the significance of the signal level occurring respectively at the individual sampling time, that is, activated or non-activated signal level, or the frequency of the signal edge occurring respectively at the individual sampling time over all of the binary signals of the bus signal is counted and displayed as a corresponding color or grey tone of the pixel. The ordinate-abscissa value pair of the respective pixel corresponds to the ordinate value, which displays a significance of the signal level of the individual binary signals at a sampling time, and to the abscissa value, which displays the sampling time.

Figure 2A:
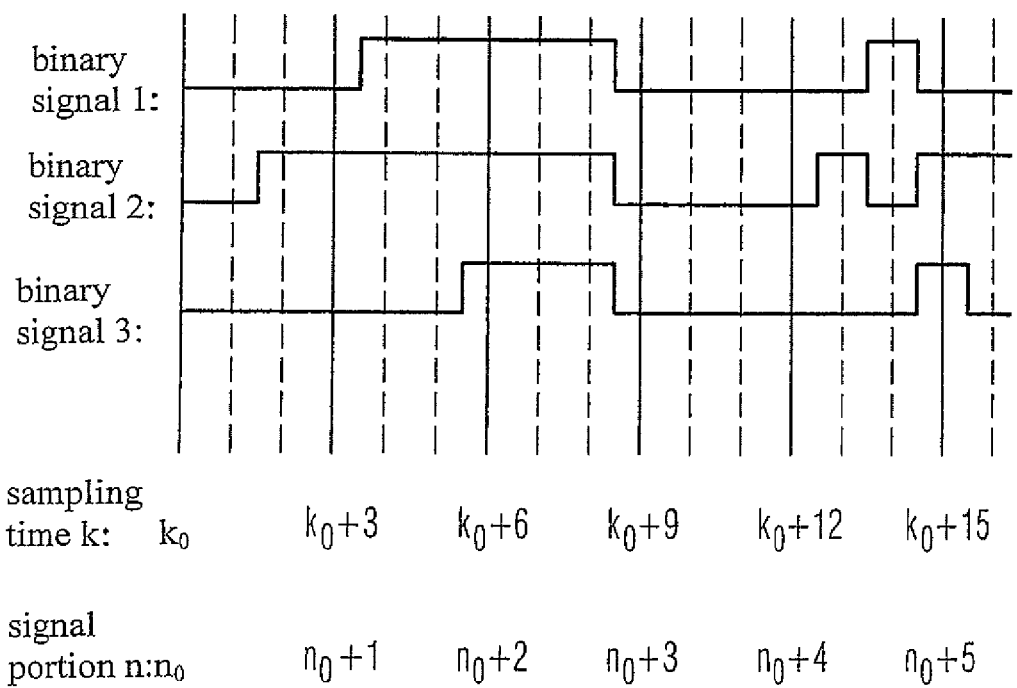
FIG. 2A shows a time-flow diagram with three binary signals associated with a bus signal.

In the case shown in FIG. 2A, according to which neither a time compression nor a time expansion of the individual binary signals associated with the bus signal is implemented, a display of the frequencies of the significances of the signal level occurring respectively at the individual sampling times or of the frequency of the signal edges occurring respectively at the individual sampling times over all of the binary signals of the bus signal is displayed in FIG. 2B. A first variant of a display for several decimated binary signals associated with a bus signal is shown in FIG. 2C for the case of a decimation by the decimation factor three, in which the frequencies of the significances of the signal level occurring at the individual sampling times respectively or the frequencies of the signal edges occurring respectively at the individual sampling times are displayed over all of the binary signals of the bus signal. FIG. 2C shows the signal edges removed through decimation from the signal portion $n_0+4$ and marked in the screen column $n_0+4$, namely the signal edges occurring three times in the binary signal 2.

Two displays for several binary signals associated with a bus signal are shown in FIG. 3B. In this context, a time compression/decimation of the binary signals by the factor two has been implemented. By analogy with the display in FIG. 1B for a single decimated binary signal, a second variant of a display is shown at the bottom in FIG. 3B, in which a separate display is provided respectively for the two binary signals from FIG. 3A. The removed signal edge occurring at the sampling time $k_0+14$ and displayed in the associated screen column $n_0+14$ is visible.

Alongside the display at the bottom of FIG. 3B, which represents a separate display for each of the two binary signals, a third variant of a display is shown at the top of FIG. 3B, in which both binary signals are combined to form one binary signal. In this context, the significance of the signal levels of the two binary signals at the individual sampling times is neutralised and displayed by a pixel representing an activated significance of the signal level, and at the same time by a pixel representing a non-activated significance of the signal level at the individual sampling times. The significances of the signal levels of the individual binary signals of the bus signal are combined in an individual binary, octal or hexadecimal value, of which the characters at the individual sampling times are placed between the pixels representing an activated significance of the signal level and a negative significance of the signal level.

Only a signal edge occurring respectively at a sampling time in one binary signal or in several binary signals is displayed by pixels in a screen column, which corresponds with one or more signal edges to the signal portion of the binary signals, and in respectively adjacent screen columns on the left and the right, which, in combination each form a signal edge with a positive signal-edge direction and a signal edge with a negative signal-edge direction. If a removed signal edge is present, the pixels forming a signal edge with a positive signal-edge direction and at the same time a signal edge with a negative signal-edge direction are displayed in a separate color or grey tone.

In a fourth variant of a display for several binary signals associated with a bus signal, the individual significances of the signal levels of the binary signals associated with the bus signal at the individual sampling times are also combined in a binary, octal or hexadecimal value and give the ordinate value of an ordinate-abscissa value pair, of which the abscissa value forms the associated sampling time. This ordinate-abscissa value pair is displayed through a pixel with a corresponding ordinate-abscissa value pair in a given color or grey tone. Pixels displayed in this manner and in time succession, and accordingly horizontally adjacent on the display of the visualization unit 2, are connected on a vertical straight line by pixels with identical grey tone or color, of which the ordinate values are disposed between the ordinate values of the pixels respectively adjacent in time and of which the abscissa value corresponds to the respectively higher abscissa value of the pixels respectively adjacent in time.

If signal edges removed through decimation occur in one or more of the decimated binary signals associated with the bus signal, these removed signal edges are displayed by pixels on a vertical straight line in a separate color or grey tone. The abscissa value of the pixels disposed on the vertical straight line, which display one or more removed signal edges, corresponds to the abscissa value of the sampling time of the decimated binary signals in which signal edges removed through decimation are present. The ordinate values of the pixels disposed on the vertical straight line which represent one or more removed signal edges, are disposed between the limit values of the value range of the binary, octal or hexadecimal value, which results from the non-unambiguous assignment of the signal level in one or more of the binary signals to a value in the case of one or more signal edges in one or more binary signals of the bus signal.

Figure 4:
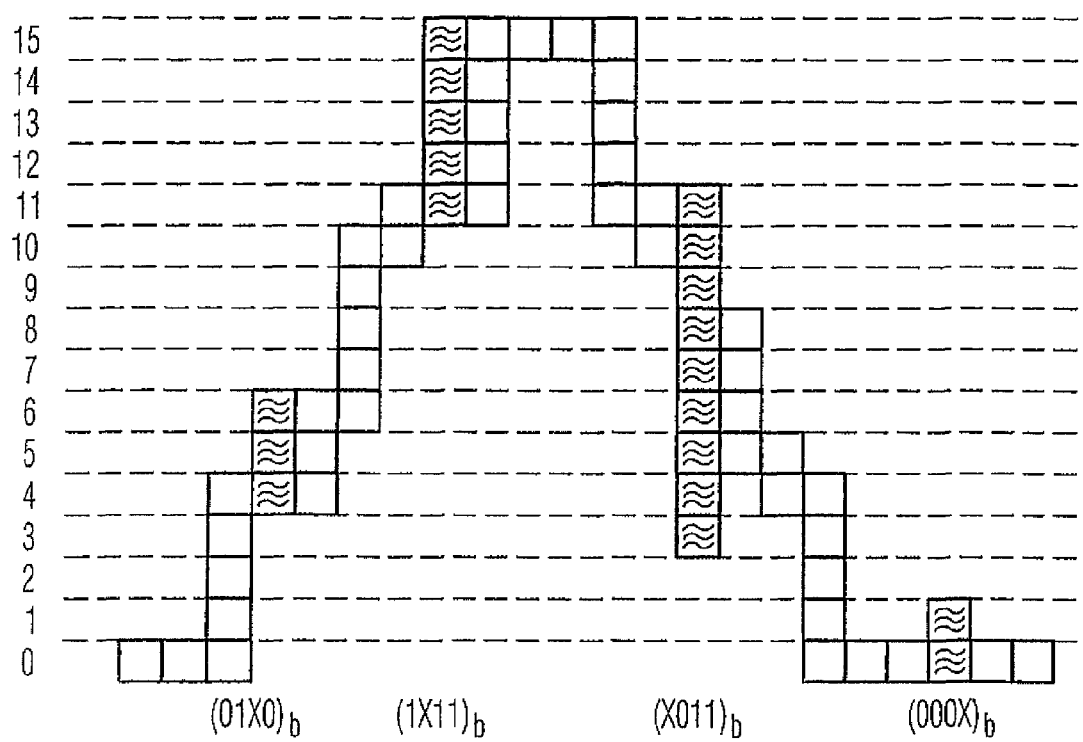
FIG. 4 shows a display according to an embodiment of the invention of four binary signals associated with a bus signal with signal edge removed through decimation.

In a fifth variant of a display, according to FIG. 4, for several binary signals associated with a bus signal, the significances of the signal levels of the individual binary signals associated with a bus signal at the individual sampling times are combined as a binary, octal and hexadecimal value, and displayed as associated characters. The binary, octal or hexadecimal characters of the respective binary, octal and hexadecimal value, which relates to a binary signal, in which a signal edge has been removed at the respective sampling time through decimation, is presented by a special character, for example X, and is optionally additionally marked by color highlighting of the special character with a special color.

In an equivalent manner to the display of several binary signals associated with a bus signal, several sequentially successive signal portions of a single binary signal can also be combined and are also covered by the invention.

Figure 6:
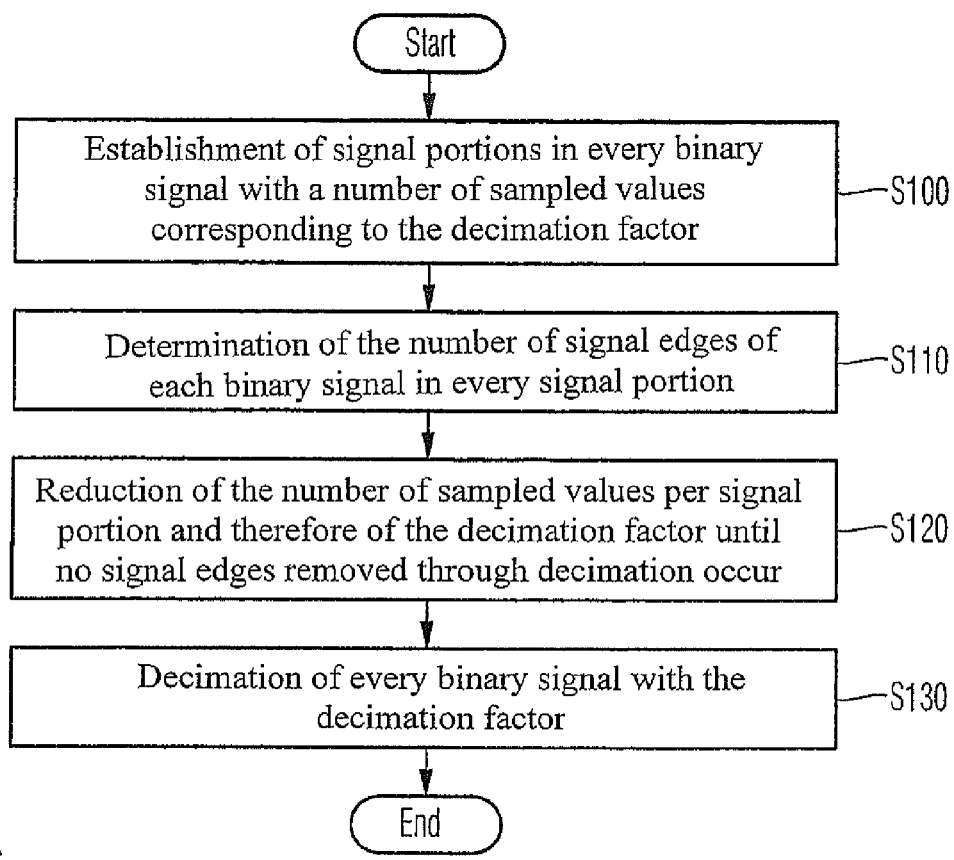
FIG. 6 shows a flow diagram for a method according to an embodiment of the invention for matching the decimation factor dependent upon the number of signal edges per number of sampled values.
Figure 9:
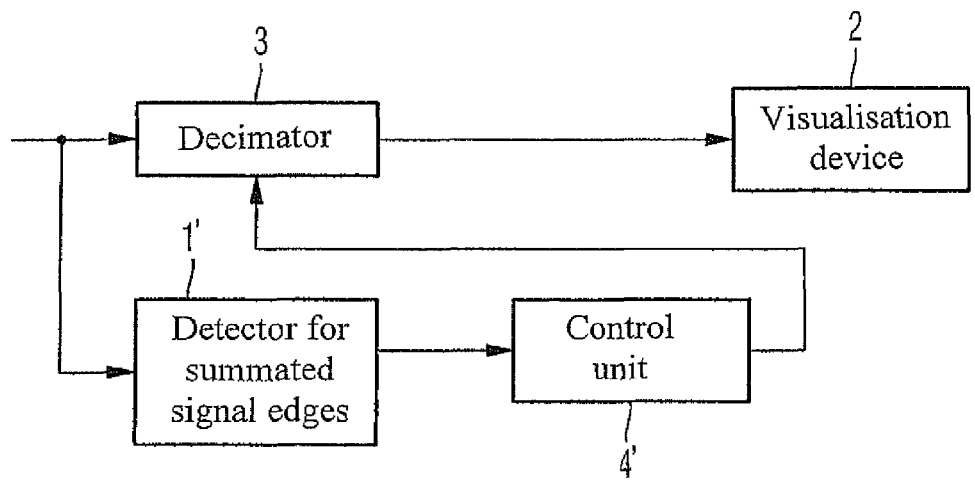
FIG. 9 shows a block-circuit diagram for a device according to an embodiment of the invention for matching the decimation factor dependent upon the number of signal edges per number of sampled values.

In the following section, the method according to the invention for matching the decimation factor dependent upon the number of signal edges per number of sampled values is described on the basis of the flow diagram in FIG. 6, and the associated device for matching the decimation factor dependent upon the number of signal edges per number of sampled values is described on the basis of the block-circuit diagram in FIG. 9.

In the first method step S100, successive signal portions with a fixed number of sampled values, which corresponds to the decimation factor of the decimation, are established for the binary signal to be decimated or respectively for each binary signal associated with a bus signal and to be decimated.

In the next method step S110, in every signal portion established in the preceding method step S20 of the binary signal to be decimated or respectively of the binary signals associated respectively with a bus signal and to be decimated, each signal edge is detected in a detector 1' for summated signal edges, and the number of signal edges per signal portion in each individual binary signal or respectively in each binary signal of the bus signal is determined through summation of the detected signal edges.

In the next method step S120, the number of sampled values per signal portion in the individual binary signal or in each binary signal associated with the bus signal, and accordingly the decimation factor for the decimation, is reduced in a control unit 4' until a maximum of one signal edge occurs in each signal portion, and accordingly, no signal edges are lost through the decimation.

In the final method step S130, the individual binary signal or the binary signals associated with the bus signal are decimated by the decimator 3 with the reduced or matched decimation factor to form an individual decimated binary signal or decimated binary signals associated with the bus signal. The decimated binary signal or respectively the decimated binary signals respectively associated with a bus signal are finally presented on the display of a visualization device 2.

Figure 7:
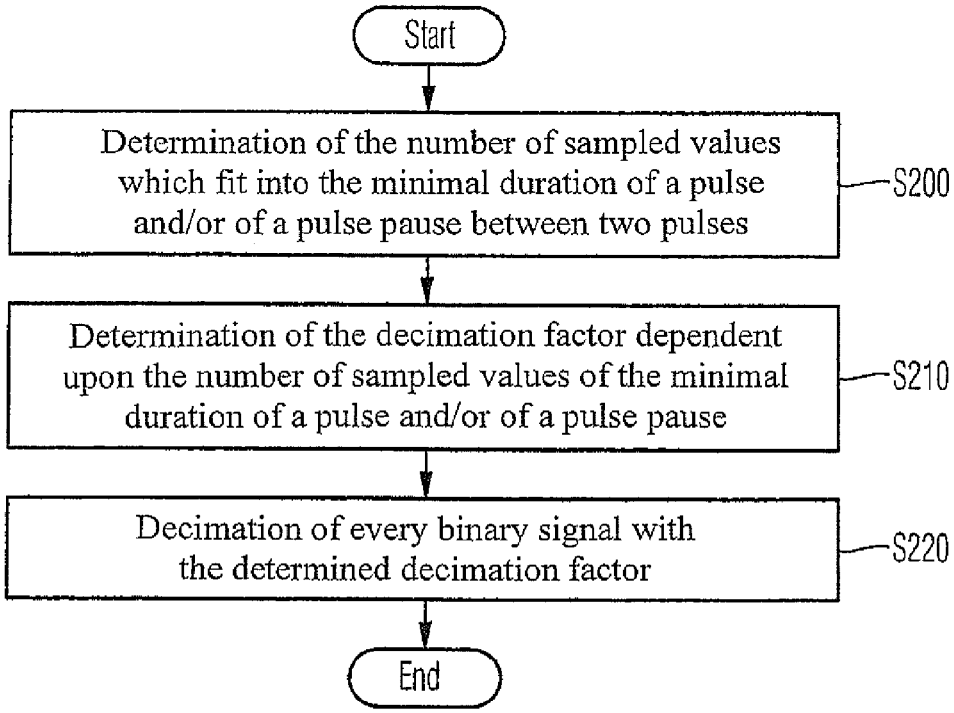
FIG. 7 shows a flow diagram for a method according to an embodiment of the invention for matching a decimation factor dependent upon the duration of pulses and/or pulse pauses.
Figure 10:
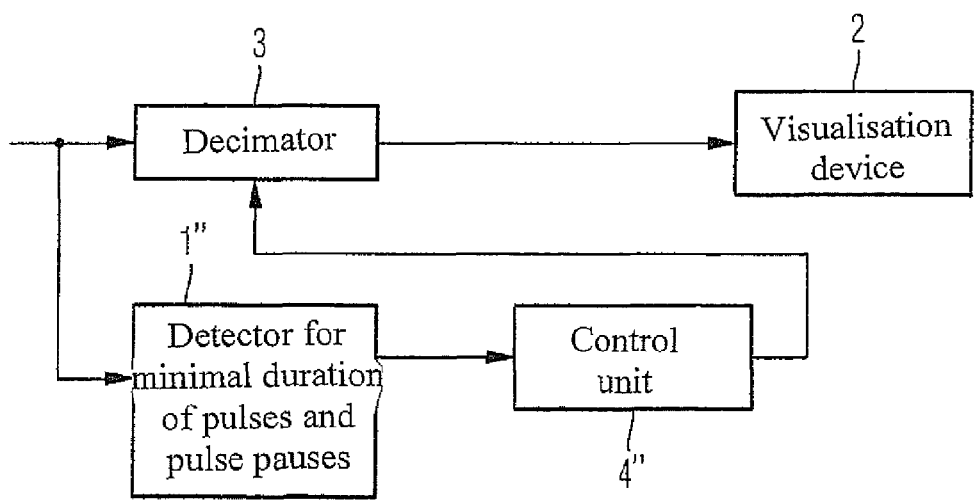
FIG. 10 shows a block-circuit diagram for a device according to an embodiment of the invention for matching a decimation factor dependent upon the duration of pulses and/or pulse pauses.

In the following section, the method according to the invention for matching a decimation factor dependent upon the duration of pulses and/or pulse pauses is described on the basis of the flow diagram in FIG. 7, and the associated device for matching a decimation factor dependent upon the duration of pulses and/or pulse pauses is described on the basis of the block-circuit diagram in FIG. 10.

In the first method step S200, for the individual binary signal or for all of the binary signals associated with a bus signal and to be decimated, the number of sampled values is determined in a detector 1" for minimal durations of pulses and pulse pauses, which occur within the minimal duration detected by the detector 1" for all detected pulses or detected pulse pauses between two successive pulses within a given period by the detector 1" in the individual binary signal or in all of the binary signals associated with the bus signal.

In the next method step S210, the decimation factor of the decimation is determined by a control unit 4" dependent upon the number of sampled values determined in the preceding method step S200, which occur in the minimal duration of all pulses and pulse pauses detected within a time period, by setting the decimation factor to be smaller than or equal to the number of sampled values, which occur in the minimal duration of all pulses and pulse pauses detected within a period.

In the final method step S220, the individual binary signal or the binary signals associated with the bus signal are decimated by the decimator 3 with the reduced or matched decimation factor to form an individual decimated binary signal or to form decimated binary signals associated with the bus signal. The decimated binary signal or respectively the decimated binary signals respectively associated with a bus signal are finally displayed on a display of a visualization device 2.

The method according to the invention and the device according to the invention for preventing signal-edge losses through decimation of binary signals are not restricted to the individual embodiments and variants presented. Alongside the separate color or grey tone of pixels, other markings of the signal edges removed through decimation in decimated binary signals such as flashing pixels or different luminosity of the pixels or marking by means of arrows are also covered by the invention.

The invention claimed is:

1. A method for marking a signal edge, which has been deleted from at least one decimated binary signal after a decimation by a decimator of the binary signal, said method comprising:

establishing successive signal portions of the respective binary signal, in each case with a number of sampled values corresponding to a decimation factor of the decimation; wherein before the decimation of the binary signal the number of edges is counted for each of the signal portions, and if the number of signal edges counted in a respective signal portion is greater than one, these signal edges cannot be unambiguously identified with regard to their signal direction after the decimation;

decimating by the decimator the binary signal with the decimation factor; wherein after the decimating, an individual signal edge and its signal edge direction within a signal portion of the binary signal is unambiguously identified if the respectively preceding and/or the respectively following signal portions each contains only one signal edge; otherwise if at least two signal edges per signal portion are present, these at least two signal edges with their correct signal-edge directions cannot be unambiguously determined from the decimated binary signal, and these at least two signal edges are determined as deleted signal edges if the adjacent signal portions infer a signal portion with a single signal edge;

detecting by a detector a signal edge deleted through the decimation of the sampled values in each signal portion of the binary signal by the decimation factor; and marking of with a particular color or gray tone, by a visualization device, the deleted signal edges received by the detector at a sampling time of the decimated binary signal.

2. The method according to claim 1, wherein
the duration of a pulse or a pause between two successive pulses of the binary signals corresponds at least to a distance between two sampled values.

3. The method according to claim 2, wherein,
in the case of at least two decimated binary signals, a frequency of two significances of the binary signal level and a frequency of the signal edges between the two significances of the binary signal level at individual sampling times of the decimated binary signals is displayed as a specific color or grey tone or as a specific pattern of a pixel of a visualization device, which is associated with the significance of the binary signal level or the signal edge at the individual sampling time.

4. The method according to claim 2, wherein,
in the case of at least two decimated binary signals, a presence of a signal edge in at least one binary signal is displayed through a positive signal edge and at a same time through a negative signal edge between two binary signal levels associated with the sampling time of the signal edge at a horizontal position on a visualization device.

5. The method according to claim 1, wherein,
in the case of at least two decimated binary signals, a frequency of two significances of a binary signal level and a frequency of the signal edges between the two significances of the binary signal level at individual sampling times of the decimated binary signals is displayed as a specific color or grey tone or as a specific pattern of a pixel of a visualization device, which is associated with the significance of the binary signal level or the signal edge at the individual sampling time.

6. The method according to claim 1, wherein,
in the case of at least two decimated binary signals, a presence of a signal edge in at least one binary signal is displayed through a positive signal edge and at a same time through a negative signal edge between two binary signal levels associated with the sampling time of the signal edge at a horizontal position on a visualization device.

7. The method according to claim 6, wherein
a deleted signal edge is displayed through a positive signal edge and at the same time through a negative signal edge between two binary signal levels in a selected color or grey tone associated with the sampling time of the signal edge at the horizontal position on the visualization device.

8. The method according to claim 6, wherein
a non-presence of a signal edge in all binary signals at the respective sampling time is displayed through a colored pixel representing an activated binary signal level and at the same time through a colored pixel representing a non-activated binary signal level.

9. The method according to claim 1, wherein,
in the case of at least two decimated binary signals, significance of the binary signal level of all binary signals at the respective sampling time results in a corresponding binary, octal or hexadecimal value.

10. The method according to claim 9, wherein
the binary, octal or hexadecimal value corresponding to the significance of the binary signal level of all binary signals at the respective sampling time is displayed at a horizontal position of a visualization device corresponding to the sampling time.

11. The method according to claim 9, wherein
the binary, octal or hexadecimal value corresponding to the significance of the binary signal level of all binary signals at the respective sampling time results in an ordinate value, and the associated sampling time results in an abscissa value, which corresponds to a pixel of a visualization device.

12. The method according to claim 11, wherein
the pixels representing individual ordinate-abscissa values are connected through pixels of the visualization device with interposed ordinate values on a vertical straight-line, which, in the case of the abscissa value, corresponds to a higher abscissa value of the two ordinate-abscissa values to be connected.

13. The method according to claim 11, wherein
a deleted signal edge is displayed through separately marked pixels of the visualization device on a vertical straight line to an abscissa value, which corresponds to the sampling time of a deletion of the signal edge, between an upper and lower pixel, which each mark limits of a value range of the binary, octal or hexadecimal value, which results in a non-unambiguous assignment of a signal level in a binary signal to a value in the case of a signal edge.

14. The method according to claim 9, wherein
the binary, octal or hexadecimal value corresponding to the significance of the binary signal level of all binary signals at the respective sampling time is displayed as a tabular value, wherein the binary, octal or hexadecimal value associated with the binary signal with a signal edge disappearing at the respective sampling time is marked with a special character.

15. A non-transitory computer readable medium comprising program-code means stored thereon for implementing all steps according to claim 1 when a program is executed on a computer or a digital signal processor.

16. A device for marking a signal edge, which disappears from at least one decimated binary signal after decimation of an associated binary signal, in the associated decimated binary signal, said device comprising:

a decimator for generating at least one decimated binary signal by decimating the associated binary signal with a decimation factor;

a detector for detecting signal edges deleted through the decimation of the sampled values in each signal portion of individual binary signals by the decimation factor; and a visualization unit for displaying the decimated binary signals in which the deleted signal edges, received by the detector, disappearing from the associated binary signals are marked with a particular color or gray tone;

wherein before the decimation of the binary signal, the number of signal edges is counted for each of the signal portions, and if the number of signal edges counted in a respective signal portion is greater than one, these signals edges cannot be unambiguously identified with regard to their signal direction after the decimation; and wherein after the decimating, an individual signal edge and its signal edge direction within a signal portion of the binary signal is unambiguously identified if the respectively preceding and/or the respectively following signal portions each contains only one signal edge; otherwise, if at least two signal edges per signal portion are present, these at least two signal edges with their correct signal edge directions cannot be unambiguously determined from the decimated binary signal, and these at least two signal edges are determined as deleted signal edges if adjacent signal portions infer a signal portion with a single signal edge.

* * * * *